(12) United States Patent
Yu et al.

(10) Patent No.: US 11,942,909 B2
(45) Date of Patent: Mar. 26, 2024

(54) AMPLIFIER AND AMPLIFICATION METHOD

(71) Applicant: SMARTER MICROELECTRONICS (GUANG ZHOU) CO., LTD., Guangzhou (CN)

(72) Inventors: Limin Yu, Guangzhou (CN); Yongle Li, Guangzhou (CN); Cheng Xu, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 628 days.

(21) Appl. No.: 17/134,391

(22) Filed: Dec. 26, 2020

(65) Prior Publication Data

US 2021/0273617 A1   Sep. 2, 2021

Related U.S. Application Data

(63) Continuation of application No. PCT/CN2020/114066, filed on Sep. 8, 2020.

(30) Foreign Application Priority Data

Feb. 27, 2020   (CN) .......................... 202010124257.3

(51) Int. Cl.
  *H03F 1/34* (2006.01)
  *H03F 1/02* (2006.01)
  *H03F 3/24* (2006.01)
  *H04W 84/04* (2009.01)

(52) U.S. Cl.
  CPC ........... *H03F 3/245* (2013.01); *H03F 1/0211* (2013.01); *H03F 1/34* (2013.01); *H03F 2200/165* (2013.01); *H04W 84/042* (2013.01)

(58) Field of Classification Search
  CPC .. H03F 3/245; H03F 1/0211; H03F 2200/165; H03F 2200/126; H03F 2200/451; H03F 1/34; H03F 3/19; H04W 84/042
  USPC ......................................................... 330/291
  See application file for complete search history.

(56) References Cited

U.S. PATENT DOCUMENTS 7,368,987 B2 *   5/2008   Blon ................... H03F 3/45183
                                                    330/86

* cited by examiner

*Primary Examiner* — Andrea Lindgren Baltzell
*Assistant Examiner* — Khiem D Nguyen
(74) *Attorney, Agent, or Firm* — Syncoda LLC; Feng Ma

(57) ABSTRACT

An amplifier includes an input circuit, an amplification circuit, and at least two feedback circuits. The input circuit is connected with an input end of the amplification circuit; an output end of the amplification circuit is connected with a first end of each of the feedback circuits respectively; a second end of each of the feedback circuits is connected with the input circuit respectively. The input circuit is configured to receive an input signal and a feedback signal; the amplification circuit is configured to amplify the input signal and the feedback signal to obtain an amplified signal. The feedback signal is fed back to the input circuit by feeding back at least a part of the amplified signal through a target feedback circuit; and the target feedback circuit is a feedback circuit that depends on the type of the input signal of the at least two feedback circuits.

13 Claims, 5 Drawing Sheets

FIG. 5

AMPLIFIER AND AMPLIFICATION METHOD

CROSS-REFERENCE TO RELATED APPLICATIONS

This application is a continuation of International Application No. PCT/CN2020/114066 filed on Sep. 8, 2020, which priority to Chinese Patent Application No. 202010124257.3 filed on Feb. 27, 2020. The disclosures of these applications are hereby incorporated by reference in their entirety.

BACKGROUND

An amplifier amplifies a signal input to the amplifier to obtain an output signal. A part of the output signal may be fed back to the input end of the amplifier through a feedback circuit to adjust the gain of the amplifier. The amplifier that achieves the above functions may be referred to as a feedback amplifier.

SUMMARY

The present disclosure relates generally to amplification technologies, and more specifically to an amplifier and an amplification method.

Various embodiments of the disclosure provide an amplifier and an amplification method, which can meet requirements of different types of input signals.

The technical solutions of the embodiments of the disclosure are realized as follows.

The embodiments of the disclosure provide an amplifier, which includes an input circuit, an amplification circuit and at least two feedback circuits; herein the input circuit is connected with an input end of the amplification circuit; an output end of the amplification circuit is connected with a first end of each of the feedback circuits respectively; and a second end of each of the feedback circuits is connected with the input circuit respectively.

Herein, the input circuit is configured to receive an input signal and a feedback signal.

The amplification circuit is configured to amplify the input signal and the feedback signal to obtain an amplified signal.

Herein, the feedback signal is fed back to the input circuit by feeding back at least a part of the amplified signal through a target feedback circuit; and the target feedback circuit is a feedback circuit that depends on the type of the input signal in the at least two feedback circuits.

In the above solution, the type of the input signal includes a first type and a second type; herein the input signal of the second type includes a first subtype and a second subtype.

In the case that the input signal is a signal of the first type or the first subtype, the target feedback circuit is a first feedback circuit of the at least two feedback circuits.

In the case that the input signal is a signal of the second subtype, the target feedback circuit is a second feedback circuit of the at least two feedback circuits.

In the above solution, the first feedback circuit includes a first capacitive element, a first resistor and a second resistor; herein, a first end of the first capacitive element is connected with the input end of the amplification circuit; a second end of the first capacitive element is connected with one end of the first resistor; the other end of the first resistor is connected with one end of the second resistor; and the other end of the second resistor is connected with the output end of the amplification circuit.

Herein, in the case that the input signal is the signal of the first type or the first subtype, at least a part of the amplified signal is fed back to the input circuit through the second resistor, the first resistor and the first capacitive element sequentially.

In the above solution, the second feedback circuit includes a second capacitive element and a third resistor; herein, a first end of the second capacitive element is connected with the input end of the amplification circuit; and a second end of the second capacitive element is connected with one end of the third resistor.

Herein, in the case that the input signal is the signal of the second subtype, at least a part of the amplified signal is fed back to the input circuit through the third resistor and the second capacitive element sequentially.

In the above solution, the second feedback circuit includes a first capacitive element, a first resistor and a turn-on circuit; herein, a first end of the first capacitive element is connected with the input end of the amplification circuit; a second end of the first capacitive element is connected with one end of the first resistor; the other end of the first resistor is connected with one end of the turn-on circuit; and the other end of the turn-on circuit is connected with the output end of the amplification circuit.

In the case that the input signal is the signal of the second subtype, at least a part of the amplified signal is fed back to the input circuit through the turn-on circuit, the first resistor and the first capacitive element sequentially.

In the above solution, the amplifier also includes a selection circuit; a first end of the selection circuit is connected with the output end of the amplification circuit; a second end of the selection circuit is connected with the first feedback circuit; and a third end of the selection circuit is connected with the second feedback circuit.

The selection circuit is configured to select the first feedback circuit as the target feedback circuit in the case that the input signal is of the first type and the first subtype.

To select the second feedback circuit as the target feedback circuit in the case that the input signal is of the second subtype.

In the above solution, the turn-on circuit is configured to be turned on in the case that the input signal is the signal of the second subtype; and to be turned off in the case that the input signal is the signal of the first type or the first subtype.

In the above solution, the turn-on circuit includes a switching unit and a diode which are connected in sequence.

Herein, the switching unit is configured to be switched off in the case that the input signal is of the first type; and to be switched on in the case that the input signal is of the second type.

The diode is configured to be turned off in the case that the input signal is of the first subtype; and to be turned on in the case that the input signal is of the second subtype.

In the above solution, the amplifier also includes a power supplying circuit; the power supplying circuit is connected with a power supplying end of the amplification circuit and is configured to supply power to the amplification circuit so that the amplification circuit operates in a linear amplification region.

The amplification circuit is configured to amplify the input signal and the feedback signal when operating in the linear amplification region.

The embodiments of the disclosure also provide an amplification method applied to an amplifier, which includes an input circuit, an amplification circuit and at least two feedback circuits; herein the input circuit is connected with an input end of the amplification circuit; an output end of the amplification circuit is connected with a first end of each of the feedback circuits respectively; and a second end of each of the feedback circuits is connected with the input circuit respectively; herein, the amplification method includes the following.

Receiving, by the input circuit, an input signal and a feedback signal.

Amplifying, by the amplification circuit, the input signal and the feedback signal to obtain an amplified signal.

Herein, the feedback signal is fed back to the input circuit by feeding back at least a part of the amplified signal through a target feedback circuit; and the target feedback circuit is a feedback circuit that depends on the type of the input signal in the at least two feedback circuits.

Various embodiments of the disclosure provide an amplifier and an amplification method, herein, the amplifier includes an input circuit, an amplification circuit and at least two feedback circuits. Herein, according to different types of input signals, the feedback circuits corresponding to different types of input signals are determined from at least two feedback circuits, as target feedback circuits of such type of input signal, and the feedback signals of such types of the input signals are fed back to the input circuit by using the target feedback circuits. In the embodiments of the disclosure, the feedback circuits corresponding to different types of input signals may be determined from at least two feedback circuits included in the amplifier, as a target feedback circuit to realize feedback of the feedback signals and normal amplification of the amplifier. The amplifier of the embodiments of the disclosure may at least meet the requirements of different types of input signals.

The amplifier can be part of an electronic device, such as a wireless communication device of a communication system.

DETAILED DESCRIPTION

In order to make the purpose, technical solutions and advantages of the disclosure clearer, the technical solutions of the embodiments of the disclosure will be described clearly and completely below with reference to the drawings of the embodiments of the disclosure, and apparently, the described embodiments are only a part of the embodiments of the disclosure, not all of them. Based on the embodiments of the disclosure, all other embodiments obtained by those ordinarily skilled in the art without paying any creative work belong to the protection scope of the disclosure. The embodiments of the disclosure and the features in the embodiments may be arbitrarily combined with each other without conflict.

A feedback circuit employed in a feedback amplifier is typically a single type, and signals input to the amplifier may be of different types. As such, a single feedback circuit typically cannot meet the requirements of different types of signals input to the amplifier.

Figure 1:
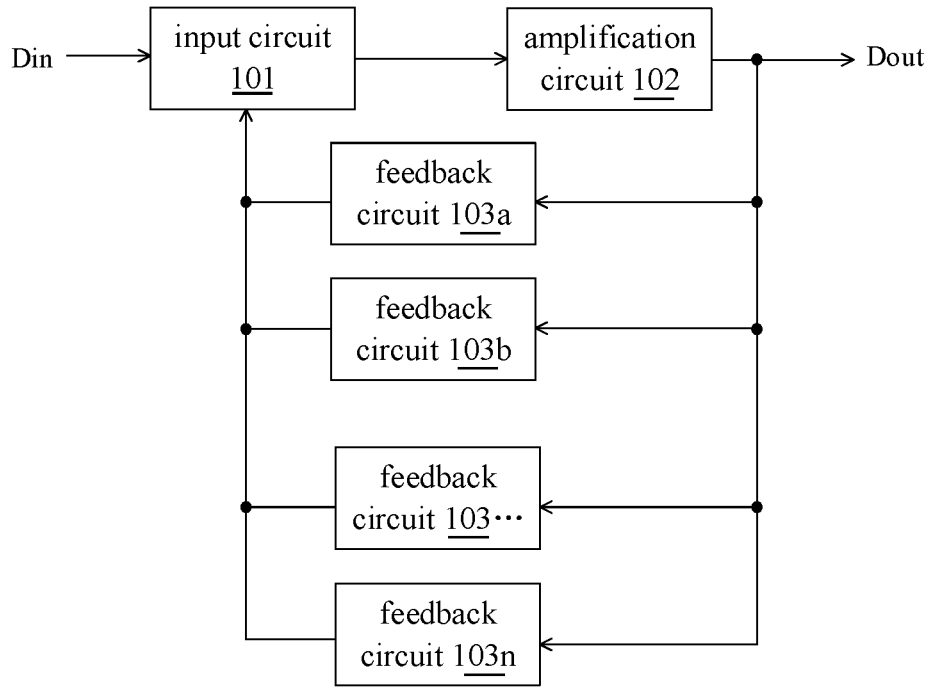
FIG. 1 is a first schematic diagram of the composition of circuit of an amplifier of an embodiment of the disclosure.

FIG. 1 illustrates an amplifier of an embodiment of the disclosure, which structurally includes an input circuit 101, an amplification circuit 102 and at least two feedback circuits 103a-103n. Herein, n is a positive integer greater than or equal to 2. In practical applications, the value of n may be consistent with the number of types of input signals that may be received by the input circuit 101, or may be less than the number of types of input signals that may be received by the input circuit 101, which may be set flexibly depending on the actual situation.

For convenience of description, the amplification circuit 102 is regarded as including an input end and an output end. Each of the feedback circuits includes a first end and a second end. Herein, the input circuit 101 is connected with the input end of the amplification circuit 102; the output end of the amplification circuit 102 is connected with a first end of each of the feedback circuits 103a-103n, respectively; and a second end of each of the feedback circuits 103a-103n is connected with the input circuit 101 respectively. Equivalently, the input circuit 101 receives an input signal (Din). The amplification circuit 102 amplifies the input signal to obtain an amplified signal generated for the input signal. Herein, at least a part of the amplified signal is fed back to an input end of the input circuit 101 through a target feedback circuit of the at least two feedback circuits 103a-103n. The signal fed back to the input circuit 101 through the target feedback circuit is referred to as feedback signal.

It may be understood that in addition to the input signal (Din), the input circuit 101 may receive a feedback signal (Df) generated for such input signal. In the case that there is a feedback signal, both the input signal Din and the feedback signal Df are input to the amplification circuit 102 and amplified by the amplification circuit 102. It may be understood that the feedback signal of the embodiments of the disclosure being fed back to the input end of the input circuit 101 through which feedback circuit, is determined by the type of the input signal that is input to the input circuit 101. Equivalently, each of the feedback circuits corresponds to different types of input signals, and for different types of input signals, the feedback circuit corresponding to the type of the signal is determined from at least two feedback circuits 103a-103n, as the target feedback circuit for each type of input signal.

In terms of implementing functionality, the input circuit 101 is configured to receive an input signal and a feedback signal.

The amplification circuit 102 is configured to amplify the input signal and the feedback signal to obtain an amplified signal; herein, the feedback signal is fed back to the input circuit by feeding back at least a part of the amplified signal through a target feedback circuit; and the target feedback circuit is a feedback circuit that depends on the type of the input signal in the at least two feedback circuits 103a-103n.

Specifically, the amplification circuit 102 may be implemented by power amplifiers made of Gallium Arsenide (GaAs), Silicon-On-Insulator (SOI), Silicon-based (Si-based), etc., it may also be implemented by power amplifiers with structures such as Heterojunction Bipolar Transistor (HBT), Complementary Metal Oxide Semiconductor (CMOS), Cascode and Stack, and the implementation thereof is not limited to the above amplification devices or structures.

In the above solution, the amplifier includes at least two feedback circuits 103a-103n, and for different types of input signals, the feedback circuit corresponding to the type of the signal is determined from the at least two feedback circuits 103a-103n, as the target feedback circuit for each type of input signal, and the feedback signal generated for the corresponding type of input signal is input to the input circuit 101 through the target feedback circuit, so as to realize amplification of the input signal and the feedback signal generated for such input signal through the amplification circuit 102. The amplifier of such type of design may at least meet the requirements of different types of input signals.

It may be understood that the amplifier of the embodiments of the disclosure is a feedback amplifier. The feedback signals generated for different types of input signals are fed back to the input circuit 101 through different feedback circuits, and are amplified by the amplification circuit 102 to realize the normal amplification function of the amplifier.

In an alternative solution, the input circuit 101 may also pre-process the input signal and the feedback signal in the case of receiving the input signal and the feedback signal generated for such input signal. Specifically, the pre-processing includes filtering out interference signals of the input signal and the feedback signal, and transmitting the input signal and the feedback signal filtered out of the interference signals to the amplification circuit 102 as input signals of the amplification circuit 102. The signal input to the amplification circuit 102 is a signal that has been filtered out of the interference signal, and there is no interference in the signal to be amplified, thereby improving the stability of the amplification of the amplifier.

In specific implementation, when receiving an input signal, the input circuit 101 may receive the input signal in a wired way (e.g., by circuit connection) or wireless way (e.g., by antenna), and the input signal is an alternate current signal (AC signal), a direct current signals (DC signal) or a combination of DC signal and AC signal.

It may be understood that in the embodiments of the disclosure, only the input signal is input into the input circuit 101 at the initial stage, and the amplification circuit 102 feeds back at least a part of the amplified signal generated for the input signal to the input circuit 101 through the target feedback circuit in the case that the input circuit 101 only receives the input signal, so as to generate a feedback signal for the input signal. It may be understood that a feedback stage is entered after the initial stage, and in the feedback stage, in addition to the input signal, the input circuit 101 may receive the feedback signal, and transmits the received feedback signal and input signal to the amplification circuit 102, which amplifies the two signals to obtain amplified signals of the two signals. At least a part of the amplified signals is fed back to the input circuit 101 through the target feedback circuit again, as a new feedback signal. The input circuit 101 transmits the new feedback signal to the amplification circuit 102 for amplification thereof again. Such repeated feedback forms a closed loop to complete the amplification function of the feedback amplifier.

Figure 2:
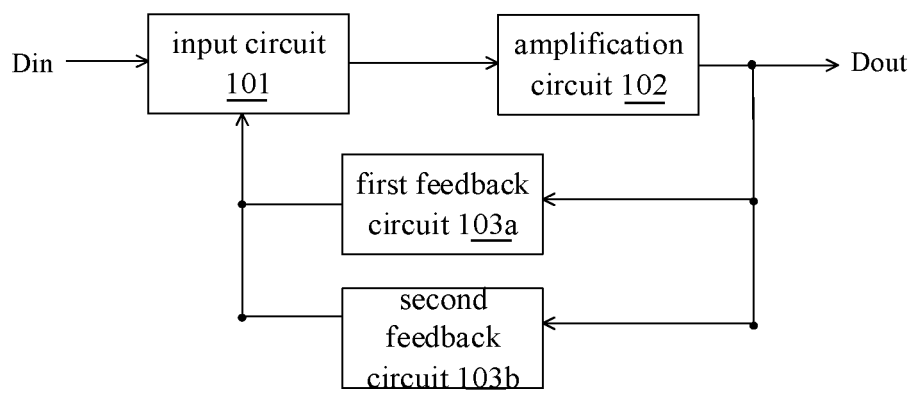
FIG. 2 is a second schematic diagram of the composition of circuit of an amplifier of an embodiment of the disclosure.

As illustrated in FIG. 2, in the embodiments of the disclosure, the type of the input signal includes a first type and a second type; herein the input signal of the second type includes a first subtype and a second subtype.

Specifically, the signal of the first type is the second-generation communication technology (2G) signal used by the communication device operating in the Global System for Mobile Communication (GSM) network mode, and the signal of the second type is the 2.75th generation communication technology (2.75G) signal used by the communication device operating in the Enhanced Data Rate for GSM Evolution (EDGE) network mode, and vice versa. The signal of the first type may also be 2G signal, and correspondingly, the signal of the second type is the third-generation communication technology (3G) signal, the fourth-generation communication technology (4G) signal or the fifth-generation communication technology (5G) signal; and vice versa. The signal of the first type may also be 3G signal, and correspondingly, the signal of the second type is 4G or 5G signal; and vice versa. The signal of the first type may also be 4G signal, and correspondingly, the signal of the second type is 5G signal; and vice versa.

Herein, taking the signal of the first type being a 2G signal and the signal of the second type being a 2.75G signal as an example. The signal of the first subtype is a large signal of the 2.75G signal, and the signal of the second subtype is a small signal of the 2.75G signal. Herein, the small signal and the large signal are classified according to the power of the signal, which is determined by the performance of the amplification circuit 102. The input signal is classified into a large signal and a small signal according to the power thereof. Generally, the large signal which is a signal with a power greater than or equal to 25 dBm (decibel relative to one milliwatt), will cause the operating state of the amplification circuit 102 to enter into the saturation region from the linear amplification region due to excessive power thereof, while a small signal which is a signal with power less than 10 dBm, will cause the amplification circuit 102 to operate in the linear amplification region. The small signal does not require too high gain, but requires better gain linearity, while the large signal is opposite thereto. The above takes the signal of the first subtype being a large signal of 2.75G signal and the signal of the second subtype being a small signal of 2.75G signal as an example, and vice versa. For the 2G signal, it's unnecessary to distinguish between the large signal and the small signal.

In an alternative embodiment, as illustrated in FIG. 2, taking the amplifier including two feedback circuits (a first feedback circuit 103a and a second feedback circuit 103b), and the signal of the first subtype being a large signal of 2.75G signal and the signal of the second subtype being a small signal of 2.75G signal as an example, and in the case that the input signal is the signal of the first type or the first subtype, the first feedback circuit 103a of the two feedback circuits 103a and 103b is used as the target feedback circuit based on the type of the input signal.

Figure 4:
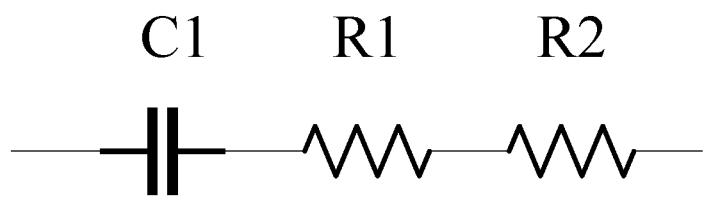
FIG. 4 is a schematic diagram of the circuit structure of a first feedback circuit of an embodiment of the disclosure.

The circuit structure of the first feedback circuit 103a is illustrated with reference to the circuit in FIG. 4. The first feedback circuit 103a includes a first capacitive element C1, a first resistor R1 and a second resistor R2; herein, a first end of the first capacitive element C1 is connected with the input end of the amplification circuit 102; a second end of the first capacitive element C1 is connected with one end of the first resistor R1; the other end of the first resistor R1 is connected with one end of the second resistor R2; and the other end of the second resistor R2 is connected with the output end of the amplification circuit 102. It may be understood that FIG. 4 is only one specific implementation of the first feedback circuit 103a, in which the first capacitive element C1 can be implemented by other capacitive circuits; and the resistors R1 and R2 may also be implemented by other components which are equivalent to resistors.

Generally, the electrical attribute values of the first resistor R1, the second resistor R2 and the first capacitive element C1 are set according to the actual situation, so that in the case that the input signal is the signal of the first type or the first subtype, at least a part of the amplified signal may be fed back to the input circuit 101 through the first feedback circuit 103a, specifically through the second resistor R2, the first resistor R1 and the first capacitive element C1 sequentially, so as to feed back the feedback signal to the input circuit 101.

It may be understood that at least a part of the amplified signal enters the first feedback circuit 103a, and then flows through the second resistor R2 and the first resistor R1 sequentially for voltage division thereof, so as to control the signal amplitude of the obtained feedback signal. The remaining signal after at least a part of the amplified signal being voltage divided by the first resistor R1 and the second resistor R2 passes through the first capacitive element C1, which is configured to filter out the DC component, thereby obtaining a feedback signal. It should be known that the feedback signal is the AC component of the remaining signal after at least a part of the amplified signal is voltage divided by two resistors.

In the above solution, for the input signal of the first type (2G signal) or the first subtype (a large signal of 2.75G signal), the first feedback circuit 103a may be used as the target feedback circuit of these types of input signals, that is, the first feedback circuit 103a is a feedback circuit for the input signal of the type corresponding to the 2G signal or the large signal of 2.75G signal, and in the case that the input signal is the 2G signal or the large signal of 2.75G signal, the first feedback circuit 103a is selected as the feedback circuit for transmitting the feedback signal of such type of signal.

As illustrated in FIG. 2, in the case that the input signal is the signal of the second type, the target feedback circuit is the second feedback circuit 103b of the two feedback circuits.

Specifically, in the case that the input signal is the signal of the second type such as the small signal of 2.75G signal, the second feedback circuit 103b is used as the target feedback circuit for transmitting the feedback signal of such type of input signal.

In the embodiments of the disclosure, the circuit structure of the second feedback circuit 103b is illustrated with reference to the circuit in FIG. 5. The second feedback circuit 103b includes a second capacitive element C2 and a third resistor R3; herein, a first end of the second capacitive element C2 is connected with the input end of the amplification circuit 102; a second end of the second capacitive element C2 is connected with one end of the third resistor R3; and the other end of the third resistor R3 is connected with the output end of the amplification circuit 102. It may be understood that FIG. 5 is only one specific implementation of the second feedback circuit 103b, in which the second capacitive element may be implemented by other capacitive circuits; and the resistor R3 may also be implemented by other components which are equivalent to resistors.

Generally, the electrical attribute values of the third resistor R3 and the second capacitive element C2 are determined according to the actual situation, so that in the case that the input signal is the signal of the second subtype, at least a part of the amplified signal is fed back to the input circuit 101 through the third resistor R3 and the second capacitive element C2 sequentially. That is, in the embodiments of the disclosure, the second feedback circuit 103b converts at least a part of the amplified signal into a desired feedback signal.

In the case that the input signal is the small signal of 2.75G signal, at least a part of the amplified signal is voltage divided while passing through the third resistor R3, consumes a part of the power of at least a part of the amplified signal, and inputs at least a part of the amplified signal other than the signal that has been voltage divided by the third resistor R3 to the second capacitive element C2. The second capacitive element C2 filters out the DC component of the signal, leaving the AC component thereof. The AC signal obtained by filtering out the DC component is input to the input circuit 101 as a feedback signal.

Figure 5:
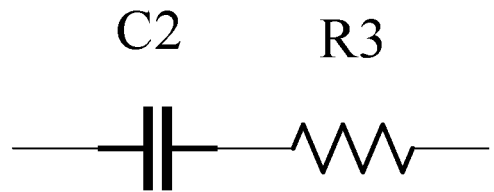
FIG. 5 is a first schematic diagram of the circuit structure of a second feedback circuit of an embodiment of the disclosure.
Figure 8:
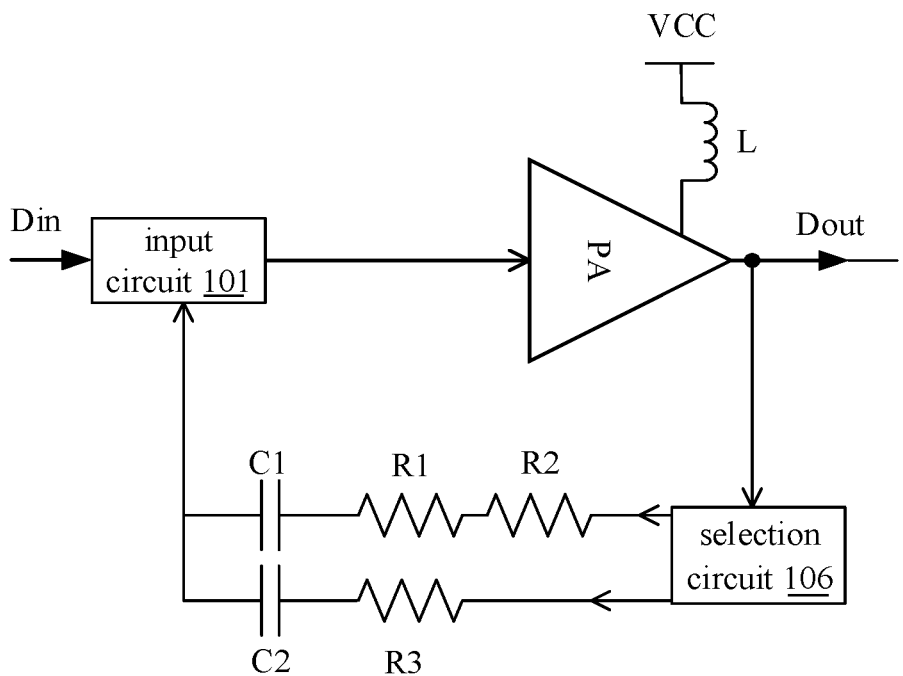
FIG. 8 is a second schematic diagram of the circuit structure of an amplifier of an embodiment of the disclosure.

In the case that the first feedback circuit 103a is illustrated in FIG. 4 and the second feedback circuit 103b is illustrated in FIG. 5, the amplifier also includes a selection circuit 106 (as illustrated in FIG. 8) to select a target feedback circuit; and a first end of the selection circuit 106 is connected with the output end of the amplification circuit 102; a second end of the selection circuit 106 is connected with the first feedback circuit 103a, specifically with the second resistor R2; and a third end of the selection circuit 106 is connected with the second feedback circuit 103b, specifically with the third resistor R3.

At least a part of the amplified signal is output from the output end of the amplification circuit 102 and input from the first end of the selecting circuit 106, and the selecting circuit 106 selects a target feedback circuit for the at least a part of the amplified signal according to the type of the input signal. Specifically, the selection circuit 106 is configured to select the first feedback circuit as the target feedback circuit in the case that the input signal is of the first type and the first subtype, and to output the at least a part of the amplified signal from the second end of the selection circuit 106 into the first feedback circuit 103a. While the selection circuit 106 is configured to select the second feedback circuit 103b as the target feedback circuit in the case that the input signal is of the second subtype, and the at least a part of the amplified signal is output from the third end of the selection circuit 106 into the second feedback circuit 103b.

Figure 6:
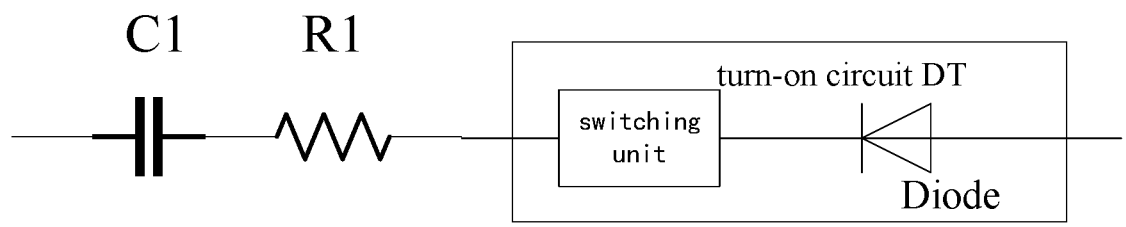
FIG. 6 is a second schematic diagram of the circuit structure of a second feedback circuit of an embodiment of the disclosure.

In the embodiments of the disclosure, the second feedback circuit 103b may also be implemented by another circuit structure. As illustrated in FIG. 6, the second feedback circuit 103b includes a first capacitive element C1, a first resistor R1 and a turn-on circuit DT; herein, a first end of the first capacitive element C1 is connected with the input end of the amplification circuit 102; a second end of the first capacitive element C1 is connected with one end of the first resistor R1; the other end of the first resistor R1 is connected with one end of the turn-on circuit; and the other end of the turn-on circuit DT is connected with the output end of the amplification circuit 102.

In the case that the input signal is the signal of the second subtype such as the small signal of 2.75G signal, at least a part of the amplified signal is fed back to the input circuit 101 through the turn-on circuit, the first resistor R1 and the first capacitive element C1 sequentially.

Herein, the turn-on circuit DT is configured to be turned on in the case that the input signal is the signal of the second subtype such as the small signal of 2.75G signal; and to be turned off in the case that the input signal is the signal of the first type or the first subtype such as 2G signal or the large signal of 2.75G signal. Specifically, at least a part of the amplified signal enters the second feedback circuit 103b, and in the case that the input signal is the signal of the second subtype, the turn-on circuit DT is turned on and operates normally, and at least a part of the amplified signal passes through the first resistor R1 and consumes a part of the power, and then passes through the first capacitive element C1 to filter out the DC signal of the signal, take the AC signal with the DC component filtered out as a feedback signal, and input the feedback signal into the input circuit 101.

In the above solution, for the input signal of the second subtype, the second feedback circuit 103b is selected as the feedback circuit of such type of input signal. For the input signal of the first type or the first subtype, the first feedback circuit 103a is selected as the feedback circuit of such type of input signal. The second feedback circuit 103b has less resistance than the first feedback circuit 103a. That is, the second feedback circuit 103b has a smaller impedance than the first feedback circuit 103a.

The second feedback circuit 103b has a smaller impedance than the first feedback circuit 103a, therefore, in the case that the input signal is the signal of the second subtype, less power of at least a part of the amplified signal is consumed by the second feedback circuit 103b, and a larger feedback signal is obtained, and the amplifier obtains a deeper feedback. Such deeper feedback avoids that when amplifying the signal of the second subtype, the operating state of the amplification circuit 102 easily enters into the saturation region from the linear amplification region due to the excessive signal input to the amplification circuit 102, thereby failing to realize normal amplification of the amplification circuit 102. Such design of the second feedback circuit 103b avoids the amplification circuit 102 operating in the saturation region, and allows the amplification circuit 102 to operate in the linear amplification region to the maximum extent, so as to achieve normal amplification and meet the requirements for better gain linearity of the input signal of the second subtype.

It may be understood that the first feedback circuit 103a has a larger impedance than the second feedback circuit 103b, so the feedback signal, obtained by the first feedback circuit 103a, of at least a part of the amplified signal is smaller, and the amplifier obtains a shallower feedback, which may obtain a larger gain of the amplification circuit, however, the improvement on the gain linearity is relatively small, which meets the requirements for high gain of the input signals of the first type and the first subtype.

In the above solution, in the case that the input signal is the small signal of 2.75G signal, the second feedback circuit 103b is determined as the target feedback circuit, and the turn-on circuit DT is turned on, and since the second feedback circuit 103b has a smaller impedance than the first feedback circuit 103a, then in the case that the input signal is the signal of the second subtype, less power of at least a part of the amplified signal is consumed by the second feedback circuit 103b, obtaining a larger feedback signal, and the amplifier obtains a deeper feedback, thereby ensuring the phenomenon that when amplifying the signal of the second subtype, the operating state of the amplification circuit 102 enters into the saturation region from the linear amplification region due to the excessive signal input to the amplification circuit 102 and cannot realize stable amplification, does not occur.

In specific implementation, the turn-on circuit DT of the embodiments of the disclosure may be realized in two ways:

First Implementation: the turn-on circuit DT is a diode or a field effect transistor such as CMOS. The turn-on voltage may be selected to allow the diode or the field-effect transistor to be turned on in the case that the input signal is the small signal of 2.75G signal, and to allow the diode or the field-effect transistor to be turned off in the case that the input signal is 2G signal or the large signal of 2.75G signal.

Second Implementation: as illustrated in FIG. 6, the turn-on circuit DT includes a switching unit and a diode which are connected in sequence.

Herein, the switching unit is configured to be switched off in the case that the input signal is of the first type; and to be switched on in the case that the input signal is of the second type.

Specifically, the switching unit may operate in a switched-off or switched-on state. Which state the switching unit operates in, may be determined based on the network mode of the communication device. For example, in the case that the communication device operates in GSM network mode and is set to use 2G, the switching unit is in the switched-off state. In the case that the communication device operates in EDGE network mode or other network modes, the switching unit may be set in the switched-on (closed) state.

In practical applications, the amplifier of the embodiments of the disclosure is not only applied to the adjustment of gain and the improvement in linearity of 2G signal and 2.75G signal, but also applied to the adjustment of gain and the improvement in linearity of signals in 3G, 4G or 5G communication technologies, etc.

In the case that the communication device switches from the EDGE network mode or other network modes to the GSM network mode (for example, switching from 5G, 4G, 3G or 2.75G to 2G), the switching unit is in the switched-off state. In the case that the communication device operates in 5G, 4G, 3G or 2.75G, the switching unit is in the closed state.

The diode is configured to be turned off in the case that the input signal is of the first subtype; and turned on in the case that the input signal is of the second subtype.

Figure 3:
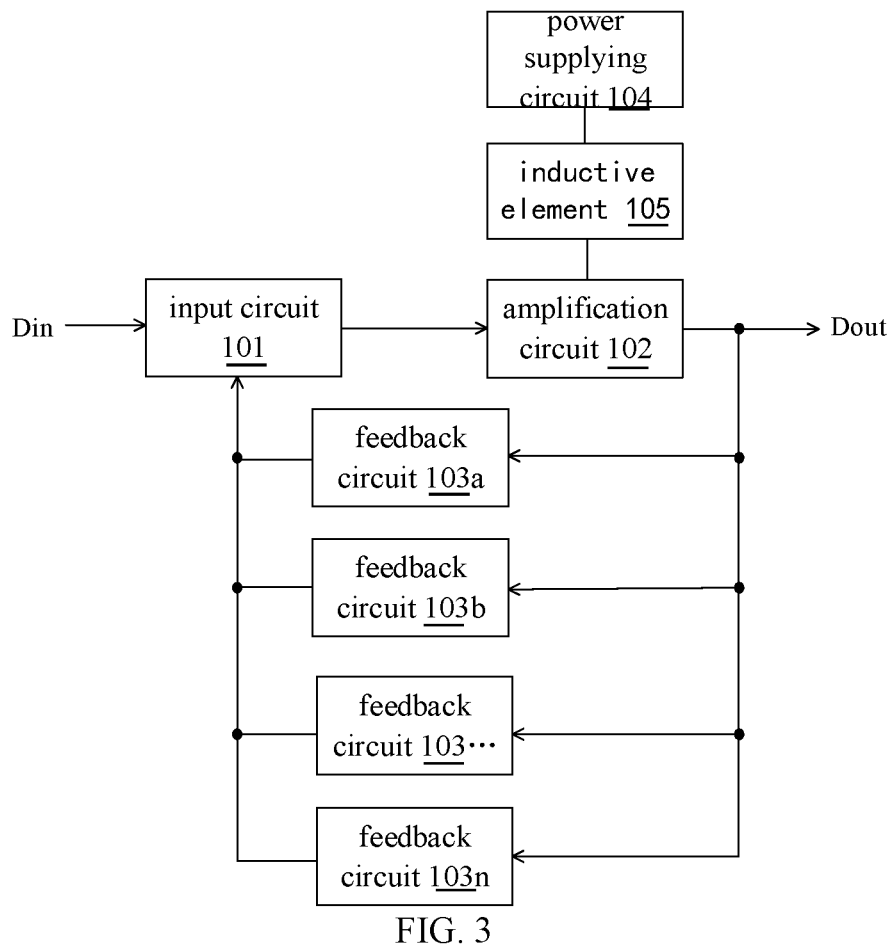
FIG. 3 is a third schematic diagram of the composition of circuit of an amplifier of an embodiment of the disclosure.

As illustrated in FIG. 3, in the embodiments of the disclosure, the amplifier also includes a power supplying circuit 104 and an inductive element 105; the power supplying circuit 104 is connected with the power supplying end of the amplification circuit 102 and configured to supply power to the amplification circuit 102 so that the amplification circuit 102 operates in the linear amplification region; and one end of the inductive element 105 is connected with the power supplying circuit 104, and the other end of the inductive element 105 is connected with the power supplying end of the amplification circuit 102, and the inductive element 105 is configured to isolate the AC signal of at least a part of the amplified signal.

In specific implementation, the power supply is a DC power supply, which provides the operating voltage for the amplification circuit 102, so that the amplification circuit 102 operates in the linear amplification region, and realizes the normal amplification of signals. The amplification factor of the amplification circuit 102 may be changed by adjusting the operating voltage, for example, in the case that the operating voltage is VCC1, then, the amplification factor is A1, and in the case that the operating voltage is VCC2, the amplification factor is A2. However, in the embodiments of the disclosure, in order for the amplification circuit 102 to achieve stable amplification, when amplifying different types of input signals, the amplification factor of the amplification circuit 102 is the same, i.e., the operating voltage provided by the power supply for the amplification circuit 102 is fixed.

The amplification circuit 102 is configured to amplify the input signal and the feedback signal when operating in the linear amplification region.

It may be understood that in addition to being able to amplify the input signal and the feedback signal to obtain the amplified signal, the amplification circuit 102 is able to determine at least a part of the amplified signal. For example, the amplification circuit 102 may sample the amplified signal, and input the sampled signal to the target feedback circuits 103a-103n, and feed it back to the input circuit 101 through the target feedback circuits.

In the above solution, the amplification circuit 102 may operate in the linear amplification region by means of the power supplying circuit 104 and the inductive element 105 to realize its normal operation.

Figure 7:
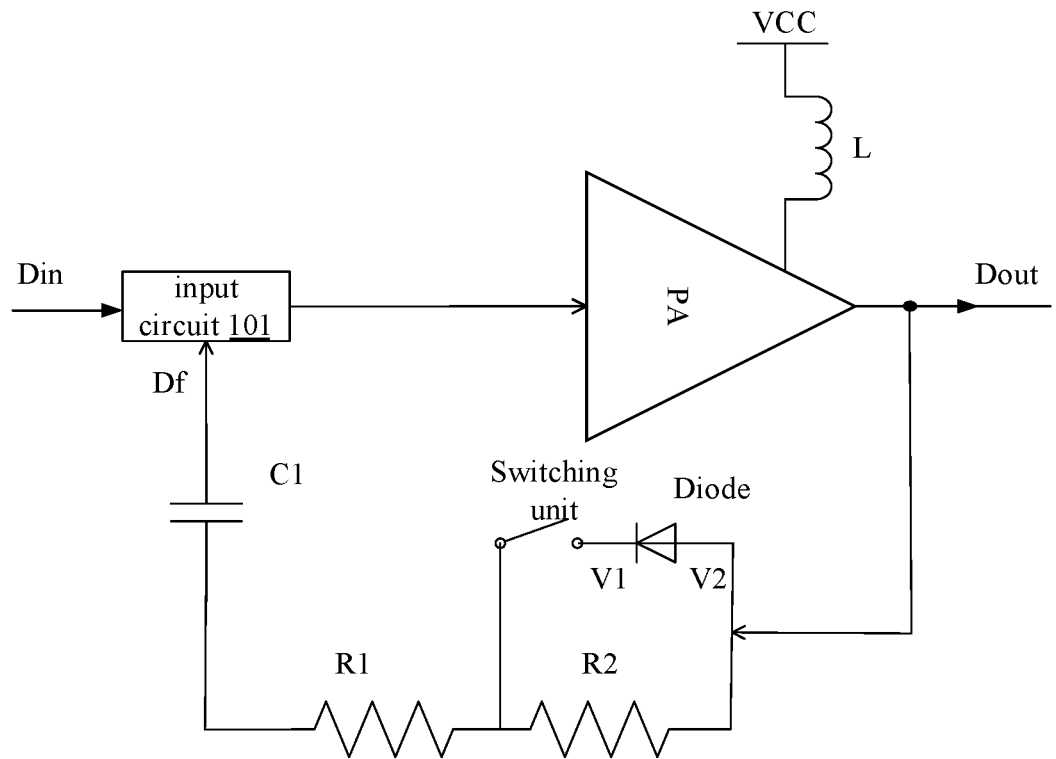
FIG. 7 is a first schematic diagram of the circuit structure of an amplifier of an embodiment of the disclosure.

Next, an amplifier disclosed in the embodiments of the disclosure will be described in detail with reference to FIGS. 7 to 9. FIG. 7 is a schematic diagram of an implementation of the circuit structure of an amplifier of an embodiment of the disclosure. FIG. 8 is a schematic diagram of another implementation of the circuit structure of an amplifier of an embodiment of the disclosure.

The first implementation of the circuit, as illustrated in FIG. 7, includes a first feedback circuit 103a (implemented by the circuit in FIG. 4) and a second feedback circuit 103b (implemented by the circuit in FIG. 6), an input circuit 101, an amplification circuit 102, a power supplying circuit 104 and an inductive element 105. Herein, the first feedback circuit 103a and the second feedback circuit 103b share the first capacitive element C1 and the first resistor R1. The power supplying circuit 104 is a DC power supply VCC, and the turn-on circuit DT includes a switching unit and a diode. The amplification circuit 102 is an amplifier (PA). The inductive element 105 is an inductor L. It may be understood that FIG. 7 illustrates an implementation of the circuit of a feedback amplifier.

When the input signal is 2G signal in GSM mode, the switching unit of the turn-on circuit is in a switched-off state, and the target feedback circuit is the first feedback circuit 103a. The input circuit 101 receives such type of input signal, and most of the input signal is transmitted to PA as the input signal of the PA, and the PA amplifies the signal input to itself to obtain an amplified signal. At least a part of the amplified signal obtains a feedback signal Df through the first feedback circuit 103a, which is fed back to the input circuit 101. Other signal except the at least a part of the amplified signal is output as an output signal Dout. Specifically, at least a part of the amplified signal is voltage divided by resistors R2 and R1 sequentially, and the capacitor C1 filters out the DC component of the remaining signal after voltage division, leaving the AC component thereof, and the capacitor C1 inputs the filtered signal to the input circuit 101 as a feedback signal.

When the input signal is the large signal of 2.75G signal in EDGE mode, the switching unit is in a closed state. The reason why the first feedback circuit 103a is selected as the target feedback circuit in this case will be explained below. The input circuit 101 receives such type of input signal, and the minority part of the input signal flows through the capacitor C1 and the closed switching unit sequentially, forming a first voltage V1 at the negative electrode of the diode (the left side of the diode). The majority part of the input signal is transmitted to PA as the input signal of the PA, and the PA amplifies the signal input to itself to obtain an amplified signal. At least a part of the amplified signal forms a second voltage V2 at the positive electrode of the diode (the right side of the diode). Since the input signal is a large signal, V1 and V2 are both large signals. V2-V1 is a small signal, the value of V2-V1 is less than or equal to the turn-on voltage Vgs of the diode, and the diode is turned off. With the diode turned off, the second feedback circuit 103b may not be used, and the first feedback circuit 103a may be used as the target feedback circuit. At least a part of the amplified signal output by the amplification circuit 102 flows through the second resistor R2, the first resistor R1 and the first capacitive device C1 of the first feedback circuit 103a sequentially to obtain a feedback signal, which is fed back to the input circuit 101. Other signal except the at least a part of the amplified signal is output as an output signal Dout. Specifically, at least a part of the amplified signal is voltage divided by resistors R2 and R1 in sequence, and the capacitor C1 filters out the DC component of the remaining signal after voltage division, leaving the AC component thereof, and the capacitor C1 inputs the filtered signal to the input circuit 101 as a feedback signal.

When the input signal is the small signal of 2.75G signal in EDGE mode, the switching unit is in a closed state. The reason why the second feedback circuit 103b is selected as the target feedback circuit in this case will be explained below. The input circuit 101 receives such type of input signal, and the minority part of the input signal flows through the capacitor C1 and the closed switching unit sequentially, forming a first voltage V1 at the negative electrode of the diode (the left side of the diode). The majority part of the input signal is transmitted to PA as the input signal of the PA, and the PA amplifies the signal input to itself to obtain an amplified signal. At least a part of the amplified signal forms a second voltage V2 at the positive electrode of the diode (the right side of the diode). Since the input signal is a small signal, V2 (a signal amplified by PA) is a large signal, V1 is a small signal, V2-V1 is a large signal, and the value of V2-V1 is greater than the turn-on voltage Vgs of the diode, and the diode is turned on. With the diode turned on, the first feedback circuit 103a (the resistor R2 of the first feedback circuit 103a is bypassed) may not be used, and the second feedback circuit 103b may be used as the target feedback circuit. At least a part of the amplified signal output by the amplification circuit 102 flows through the diode, the switching unit, the resistor R1 and the capacitor C1 of the second feedback circuit 103b sequentially to obtain a feedback signal, which is fed back to the input circuit 101. Other signal except the at least a part of the amplified signal is output as an output signal Dout. Specifically, at least a part of the amplified signal is voltage divided by the resistor R1, and the capacitor C1 filters out the DC component of the remaining signal after voltage division, leaving the AC component thereof, and the capacitor C1 inputs the filtered signal into the input circuit 101 as a feedback signal.

Another specific implementation of the amplifier, as illustrated in FIG. 8, includes a first feedback circuit 103a (implemented by the circuit in FIG. 4) and a second feedback circuit 103b (implemented by the circuit in FIG. 5), a selection circuit 106, an input circuit 101, a power supplying circuit 104 and an inductive element 105. Herein, a first end of the selection circuit 106 is connected with the output end of the amplification circuit 102; a second end of the selection circuit 106 is connected with the first feedback circuit 103a, specifically the second resistor R2; and a third end of the selection circuit 106 is connected with the second feedback circuit 103b, specifically the third resistor R3. The power supplying circuit 104 is a DC power supply VCC. The amplification circuit 102 is PA. The inductive element 105 is an inductor L. It may be understood that FIG. 8 illustrates another implementation of the circuit of a feedback amplifier.

When the input signal is 2G signal in GSM mode and the large signal of 2.75G signal in EDGE mode, the selection circuit 106 selects the first feedback circuit 103a as the target feedback circuit, and when the input signal is the small signal of 2.75G signal in EDGE mode, the selection circuit 106 selects the second feedback circuit 103b as the target feedback circuit. Specifically, the selection circuit 106 may be a single-pole-double-throw (SPDT) switch, with one end connected with the input end of the amplification circuit 102, and the other end connected with the first feedback circuit 103a when the input signal is 2G signal and the large signal of 2.75G signal, and connected with the second feedback circuit 103b when the input signal is the small signal of 2.75G signal. The selection circuit 106 may also be a relay that controls the switch connected with the first feedback circuit 103a to pull up and the switch connected with the second feedback circuit 103b to fall down when the input signal is 2G signal and the large signal of 2.75G signal, and vice versa when the input signal is the small signal of 2.75G signal.

Specifically, when the input signal is 2G signal and the large signal of 2.75G signal, they are both large signals. The reason why the first feedback circuit 103b is selected as the target feedback circuit in this case will be explained below. The input circuit 101 receives such type of input signal, and most of the input signal is transmitted to PA as the input signal of the PA, and the PA amplifies the signal input to itself to obtain an amplified signal. According to the type of signal for the input signal being the large signal, the selection circuit 106 connects with the first feedback circuit 103a by turning on the output end of the amplification circuit 102, and selects the first feedback circuit 103a as the target feedback circuit, so that at least a part of the amplified signal flows through the resistor R2, the resistor R1 and the capacitor C1 of the first feedback circuit 103a sequentially to obtain a feedback signal, which is fed back to the input circuit 101. Other signal except the at least a part of the amplified signal is output as an output signal Dout. Specifically, at least a part of the amplified signal is voltage divided by resistors R2 and R1 sequentially, and the capacitor C1 filters out the DC component of the remaining signal after voltage division, leaving the AC component thereof, and the capacitor C1 inputs the filtered signal to the input circuit 101 as a feedback signal.

Specifically, when the input signal is the small signal of 2.75G signal, it is a small signal. The reason why the second feedback circuit 103b is selected as the target feedback circuit in this case will be explained below. The input circuit 101 receives such type of input signal, and most of the input signal is transmitted to PA as the input signal of the PA, and the PA amplifies the signal input to itself to obtain an amplified signal. According to the type of signal for the input signal being the small signal, the selection circuit 106 connects with the second feedback circuit 103b by turning on the output end of the amplification circuit 102, and selects the second feedback circuit 103b as the target feedback circuit, so that at least a part of the amplified signal flows through the resistor R3 and the capacitor C2 of the second feedback circuit 103b sequentially to obtain a feedback signal, which is fed back to the input circuit 101. Other signal except the at least a part of the amplified signal is output as an output signal Dout. Specifically, at least a part of the amplified signal is voltage divided by the resistor R3, and the capacitor C2 filters out the DC component of the remaining signal after voltage division, leaving the AC component thereof, and the capacitor C2 inputs the filtered signal to the input circuit 101 as a feedback signal.

It should be noted herein that in the above solution, the input circuit 101 subtracts the input signal from the feedback signal after receiving the input signal and the feedback signal, and the subtracted signal is taken as the input of the PA. Those skilled in the art should know that in the embodiments of the disclosure, the feedback signal which is fed back to the input circuit 101 by at least one of the first feedback circuit 103a or the second feedback circuit 103b is a negative feedback signal, and the input signal, together with the negative feedback signal, are taken as the input signal of the PA. In the case that the input signal of the PA is only the input signal received by the input circuit 101, it is equivalent to reducing the signal input to the PA, so as to avoid the effect that the amplification circuit 102 easily switches from the linear operation region to the saturation region and cannot realize normal amplification due to the excessive signal input to the amplification circuit 102. The feedback circuit of the embodiments of the disclosure allows the feedback signal to be negative feedback, which ensures the PA to operate in the linear operation region and ensures the normal amplification of the PA. The input signal, together with the negative feedback signal, are taken as the input signal of the PA to achieve the effect of suppressing the power of the input signal (a negative feedback effect). It can be seen that in the embodiments of the disclosure, at least two feedback circuits 103a-103n are provided for the amplifier, and for different types of input signals, corresponding feedback circuits are selected as target feedback circuits from the at least two feedback circuits 103a-103n, and different feedback circuits get different negative feedback signals, that is, different feedback circuits have different degrees of suppression of the input signal (different depths of negative feedback). For example, in the case that the input signal is the large signal (the large signal of 2G signal and the large signal of 2.75G signal), the first feedback circuit 103a is selected as the target feedback circuit, and since the impedance of the first feedback circuit 103a is larger than that of the second feedback circuit 103b, the consumption of at least a part of the amplified signal is greater, and the obtained feedback signal has a relatively shallow feedback. In the case that the input signal is the small signal (the small signal of 2.75G signal), the second feedback circuit 103b is selected as the target feedback circuit, and since the impedance of the second feedback circuit 103b is smaller than that of the first feedback circuit 103a, the consumption of at least a part of the amplified signal is smaller, and the obtained feedback signal has a relatively deep feedback. By suppressing the power of different types of input signals by different feedback circuits, the power range of the signal that is linearly amplified by the amplification circuit 102 may be extended, that is, the linearity of the amplification gain may be improved.

Figure 9:
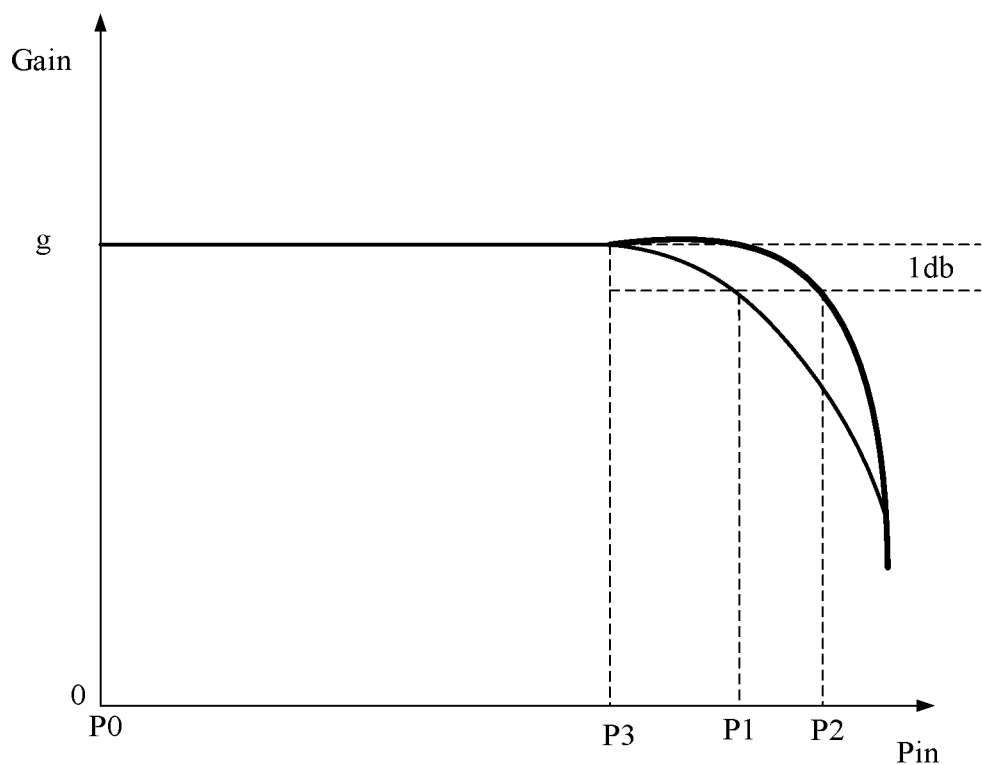
FIG. 9 is a schematic diagram of power-gain of an amplifier of an embodiment of the disclosure.

With reference to FIG. 9, how to improve the gain linearity by the amplifier of the embodiments of the disclosure will be described in detail below. As illustrated in FIG. 9, the power-gain diagram of the amplifier of the embodiments of the disclosure is illustrated, herein the power is the power of the input signal.

In the case that the circuit structure of the amplifier is not provided with at least two feedback circuits 103a-103n, the amplification circuit 102 may linearly amplify the input signal with power in the range of P0-P3, with a gain of g, however, when the power of the input signal is greater than P3, the gain of the amplification circuit 102 begins to attenuate, and it attenuates by 1 dB (decibel) when the power of the input signal is P1. In the case that the circuit structure of the amplifier is provided with at least two feedback circuits 103a-103n, the amplification circuit 102 may linearly amplify the input signal with power in the range of P0-P1, with a gain of g, and when the power of the input signal exceeds P1, the gain of the amplification circuit 102 begins to attenuate, and it attenuates by 1 dB when the power of the input signal reaches P2. Herein, P0 is the minimum power of the input signal that allows the amplification circuit 102 to operate in the linear amplification region, and P2>P1>P3>P0.

It may be understood that the amplifier of the embodiments of the disclosure improves the gain linearity of the amplification circuit 102 by adding at least two feedback circuits 103a-103n, specifically extending the power range of the linearly amplified signal by the amplification circuit 102, thereby making the amplification performance of the amplifier more stable.

In the above solution, according to the type of the input signal, one feedback circuit is selected from at least two feedback circuits 103a-103n, as the target feedback circuit, and at least a part of the amplified signal passes through the target feedback circuit to obtain a negative feedback signal, which is input to the input circuit 101. The amplification circuit 102 then amplifies the signal obtained by adding the negative feedback signal and the input signal. Herein, the signal input to the amplification circuit 102 is the signal after the input signal is pulled down (adding the input signal and the negative feedback signal is equivalent to the absolute value of the input signal subtracting the negative feedback signal), and compared with the case that the signal input to the amplification circuit 102 is the input signal received by the input circuit 101, the signal that has been pulled down is input to the amplification circuit 102, which is equivalent to suppressing the signal input to the amplification circuit 102, thereby improving the linearity of the amplification gain. In addition, for different input signals input to the input circuit 101, the corresponding feedback circuit is selected as the target feedback circuit, which meets different requirements of gains of different types of input signals and makes the amplification performance of the amplifier more stable.

Figure 10:
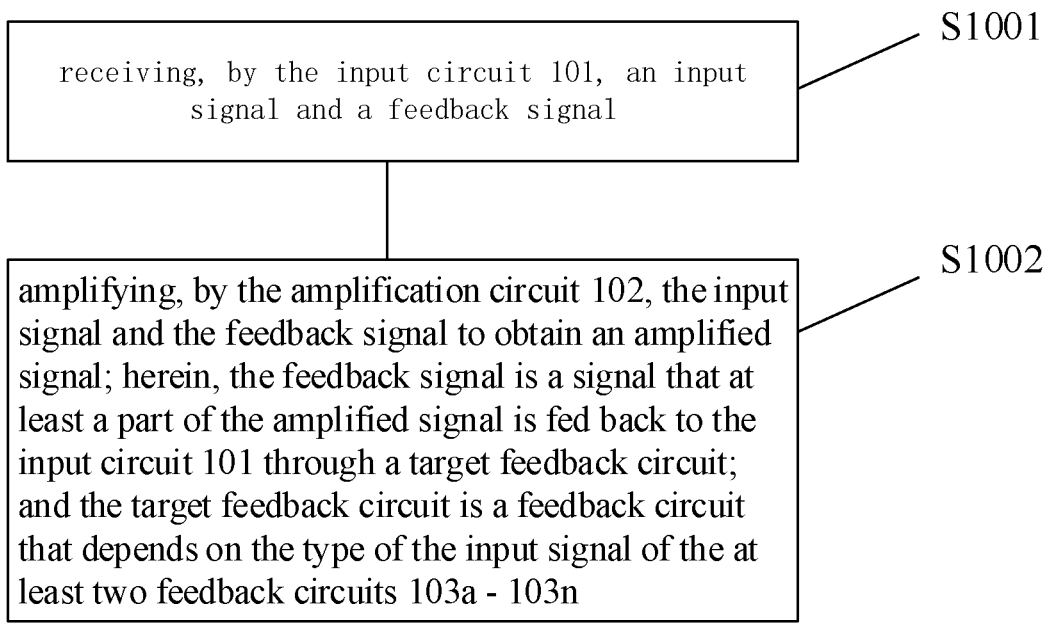
FIG. 10 is a schematic flow diagram of an amplification method of an embodiment of the disclosure.

As illustrated in FIG. 10, the embodiments of the disclosure also provide an amplification method, which is applied to an amplifier.

The amplifier includes an input circuit 101, an amplification circuit 102 and at least two feedback circuits 103a-103n; herein, the input circuit 101 is connected with an input end of the amplification circuit 102; an output end of the amplification circuit 102 is connected with one end of each of the feedback circuits respectively; a second end of each of the feedback circuits is connected with the input circuit 101 respectively.

In S1001: receiving, by the input circuit 101, an input signal and a feedback signal.

In S1002: amplifying, by the amplification circuit 102, the input signal and the feedback signal to obtain an amplified signal. Herein, the feedback signal is fed back to the input circuit 101 by feeding back at least a part of the amplified signal through a target feedback circuit; and the target feedback circuit is a feedback circuit that depends on the type of the input signal in the at least two feedback circuits 103a-103n.

In the above solution, the type of the input signal includes a first type and a second type; herein the input signal of the second type includes a first subtype and a second subtype.

In the case that the input signal is a signal of the first type or the first subtype, the target feedback circuit is a first feedback circuit 103a of the at least two feedback circuits 103a-103n.

In the case that the input signal is a signal of the second subtype, the target feedback circuit is a second feedback circuit 103b of the at least two feedback circuits 103a-103n.

In the above solution, the first feedback circuit 103a includes a first capacitive element, a first resistor and a second resistor; herein, a first end of the first capacitive element is connected with the input end of the amplification circuit 102; a second end of the first capacitive element is connected with one end of the first resistor; the other end of the first resistor is connected with one end of the second resistor; and the other end of the second resistor is connected with the output end of the amplification circuit 102.

Herein, in the case that the input signal is a signal of the first type or the first subtype, at least a part of the amplified signal is fed back to the input circuit 101 through the second resistor, the first resistor and the first capacitive element sequentially.

In the above solution, the second feedback circuit 103b includes a second capacitive element and a third resistor; herein, a first end of the second capacitive element is connected with the input end of the amplification circuit 102; and a second end of the second capacitive element is connected with one end of the third resistor.

Herein, in the case that the input signal is a signal of the second subtype, at least a part of the amplified signal is fed back to the input circuit 101 through the third resistor and the second capacitive element sequentially.

In the above solution, the second feedback circuit 103b includes a first capacitive element, a first resistor and a turn-on circuit; herein, a first end of the first capacitive element is connected with the input end of the amplification circuit 102; a second end of the first capacitive element is connected with one end of the first resistor; the other end of the first resistor is connected with one end of the turn-on circuit; and the other end of the turn-on circuit is connected with the output end of the amplification circuit.

In the case that the input signal is a signal of the second subtype, at least a part of the amplified signal is fed back to the input circuit through the turn-on circuit, the first resistor and the first capacitive element sequentially.

In the above solution, the amplifier also includes a selection circuit 106; a first end of the selection circuit 106 is connected with the output end of the amplification circuit 102; a second end of the selection circuit 106 is connected with the first feedback circuit 103a; and a third end of the selection circuit 106 is connected with the second feedback circuit 103b.

With the selection circuit 106, the first feedback circuit 103a is selected as the target feedback circuit in the case that the input signal is of the first type and the first subtype, and the second feedback circuit 103b is selected as the target feedback circuit in the case that the input signal is of the second subtype.

In the above solution, the turn-on circuit is turned on in the case that the input signal is the signal of the second subtype; and is turned off in the case that the input signal is the signal of the first type or the first subtype.

In the above solution, the turn-on circuit includes a switching unit and a diode which are connected in sequence.

Herein, the switching unit is switched off in the case that the input signal is of the first type; and is switched off in the case that the input signal is of the second type.

The diode is turned off in the case that the input signal is of the first subtype; and is turned on in the case that the input signal is of the second subtype.

In the above solution, the amplifier also includes a power supplying circuit 104; by connecting the power supplying circuit 104 with the power supplying end of the amplification circuit 102 to supply power to the amplification circuit 102 so that the amplification circuit 102 operates in the linear amplification region.

The amplification circuit 102 operates in the linear amplification region and amplify the input signal and the feedback signal.

It should be noted that for the amplification method of the embodiments of the disclosure, the principle of the amplification method to solve the problem is similar to that of the above-mentioned amplifier, therefore, the implementation process and implementation principle of the amplification method may refer to the description of the implementation process and implementation principle of the above-mentioned amplifier, and the repetition of descriptions will not be repeated.

In several embodiments provided in the disclosure, it should be understood that the disclosed device and method may be implemented in other ways. The above-mentioned device embodiments are merely illustrative, for example, the division of the units is only a division based on logical functions, and there may be other divisions in actual implementations, e.g., multiple units or components may be combined, or may be integrated in another system, or some features may be ignored, or may not be performed. In addition, the coupling, or direct coupling, or communication connection between the components illustrated or discussed may be indirect coupling or communication connection through some interfaces, devices or units, which may be electrical, mechanical or otherwise.

The above-mentioned units illustrated as separate components may be or may not be physically separated, and the components illustrated as units may be or may not be physical units, i.e., they may be located in one place or distributed to multiple network units; some or all of the units may be selected according to actual needs to achieve the purpose of the solutions of the embodiments.

In addition, each functional unit in each of the embodiments of the disclosure may be all integrated in a processing unit, or each unit may be separately present as a single unit, or two or more units may be integrated in a single unit; the above integrated units may be realized either in the form of hardware or in the form of hardware together with software functional units.

Those skilled in the art may understand that all or a part of the steps to realize the above-mentioned embodiments of the method may be realized by hardware related to program instructions, and the above-mentioned program may be stored in a computer readable storage medium, and when the program is executed, the steps including the above-mentioned embodiments of the method are executed; and the above-mentioned storage medium include various medium that may store program codes, such as mobile storage devices, Read-Only Memory (ROM), Random Access Memory (RAM), magnetic disks or optical disks, etc.

In some embodiments of the disclosure, an amplifier can include at least two feedback circuits, and for different types of input signals, the corresponding feedback circuits may be determined from the at least two feedback circuits as the target feedback circuit, so that the feedback signal may be fed back by the target feedback circuit to realize normal amplification of the amplifier. The amplifier of the embodiments of the disclosure may at least meet the requirements of different types of input signals, and the amplifier is highly practical and feasible.

The terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. An amplifier, comprising:
   an input circuit, an amplification circuit and at least two feedback circuits;
   wherein
   the input circuit is connected with an input end of the amplification circuit; an output end of the amplification circuit is connected with a first end of each of the feedback circuits respectively; and a second end of each of the feedback circuits is connected with the input circuit respectively;
   the input circuit is configured to receive an input signal and a feedback signal; the amplification circuit is configured to amplify the input signal and the feedback signal to obtain an amplified signal;
   the feedback signal is fed back to the input circuit by feeding back at least a part of the amplified signal through one target feedback circuit of the at least two feedback circuits
   depending on a type of the input signal;
   the input signal comprises a first type and a second type;
   the input signal of the second type comprises a first subtype and a second subtype;
   in a case that the input signal is a signal of the first type or the first subtype, the one target feedback circuit is a first feedback circuit of the at least two feedback circuits;
   in a case that the input signal is a signal of the second subtype, the one target feedback circuit is a second feedback circuit of the at least two feedback circuits;
   the first feedback circuit comprises a first capacitive element, a first resistor and a second resistor;
   a first end of the first capacitive element is connected with the input end of the amplification circuit;
   a second end of the first capacitive element is connected with one end of the first resistor; the other end of the first resistor is connected with one end of the second resistor; and the other end of the second resistor is connected with the output end of the amplification circuit;
   in a case that the input signal is the signal of the first type or the first subtype, at least a part of the amplified signal is fed back to the input circuit through the second resistor, the first resistor and the first capacitive element sequentially;
   the second feedback circuit comprises a first capacitive element, a first resistor and a turn-on circuit; wherein a first end of the first capacitive element is connected with the input end of the amplification circuit; a second end of the first capacitive element is connected with one end of the first resistor; the other end of the first resistor is connected with one end of the turn-on circuit; and the other end of the turn-on circuit is connected with the output end of the amplification circuit; and
   in a case that the input signal is the signal of the second subtype, at least a part of the amplified signal is fed back to the input circuit through the turn-on circuit, the first resistor and the first capacitive element sequentially.

2. The amplifier of claim 1, wherein
   the second feedback circuit comprises a second capacitive element and a third resistor; wherein a first end of the second capacitive element is connected with the input end of the amplification circuit; and a second end of the second capacitive element is connected with one end of the third resistor; and
   in a case that the input signal is the signal of the second subtype, at least a part of the amplified signal is fed back to the input circuit through the third resistor and the second capacitive element sequentially.

3. The amplifier of claim 2, further comprising a selection circuit;
   wherein
   a first end of the selection circuit is connected with the output end of the amplification circuit; a second end of the selection circuit is connected with the first feedback circuit; and a third end of the selection circuit is connected with the second feedback circuit;
   the selection circuit is configured to select the first feedback circuit as the one target feedback circuit in the case that the input signal is of the first type and the first subtype; and
   to select the second feedback circuit as the one target feedback circuit in the case that the input signal is of the second subtype.

4. The amplifier of claim 1, wherein the turn-on circuit is configured to be turned on in the case that the input signal is the signal of the second subtype; and to be turned off in the case that the input signal is the signal of the first type or the first subtype.

5. The amplifier of claim 1, wherein
   the turn-on circuit comprises a switching unit and a diode which are connected in sequence;
   the switching unit is configured to be switched off in the case that the input signal is of the first type; and to be switched on in the case that the input signal is of the second type; and
   the diode is configured to be turned off in the case that the input signal is of the first subtype; and to be turned on in the case that the input signal is of the second subtype.

6. The amplifier of claim 1, further comprising a power supplying circuit;
   wherein
   the power supplying circuit is connected with a power supplying end of the amplification circuit and is configured to supply power to the amplification circuit so that the amplification circuit operates in a linear amplification region; and
   the amplification circuit is configured to amplify the input signal and the feedback signal when operating in the linear amplification region.

7. An amplification method applied to an amplifier comprising an input circuit, an amplification circuit and at least two feedback circuits;
   wherein the input circuit is connected with an input end of the amplification circuit; an output end of the amplification circuit is connected with a first end of each of the at least two feedback circuits respectively; a second end of each of the feedback circuits is connected with the input circuit respectively;

the method comprising:

receiving, by the input circuit, an input signal and a feedback signal; and amplifying, by the amplification circuit, the input signal and the feedback signal to obtain an amplified signal; wherein the feedback signal is fed back to the input circuit by feeding back at least a part of the amplified signal through one target feedback circuit of the at least two feedback circuits depending on a type of the input signal;

the input signal comprises a first type and a second type;

the input signal of the second type comprises a first subtype and a second subtype;

in a case that the input signal is a signal of the first type or the first subtype, the one target feedback circuit is a first feedback circuit of the at least two feedback circuits;

in a case that the input signal is a signal of the second subtype, the one target feedback circuit is a second feedback circuit of the at least two feedback circuits;

the first feedback circuit comprises a first capacitive element, a first resistor and a second resistor;

a first end of the first capacitive element is connected with the input end of the amplification circuit;

a second end of the first capacitive element is connected with one end of the first resistor; the other end of the first resistor is connected with one end of the second resistor; and the other end of the second resistor is connected with the output end of the amplification circuit;

in a case that the input signal is the signal of the first type or the first subtype, at least a part of the amplified signal is fed back to the input circuit through the second resistor, the first resistor and the first capacitive element sequentially;

the second feedback circuit comprises a first capacitive element, a first resistor and a turn-on circuit; wherein a first end of the first capacitive element is connected with the input end of the amplification circuit; a second end of the first capacitive element is connected with one end of the first resistor; the other end of the first resistor is connected with one end of the turn-on circuit; and the other end of the turn-on circuit is connected with the output end of the amplification circuit; and in a case that the input signal is the signal of the second subtype, at least a part of the amplified signal is fed back to the input circuit through the turn-on circuit, the first resistor and the first capacitive element sequentially.

8. A communication system comprising the amplifier of claim 1, wherein the at least two feedback circuits correspond to different types of input signals including at least two of 2G, 2.75G, 3G, 4G, and 5G input signals.

9. The communication system of claim 8, wherein the second feedback circuit comprises a second capacitive element and a third resistor; wherein a first end of the second capacitive element is connected with the input end of the amplification circuit; and a second end of the second capacitive element is connected with one end of the third resistor; and in a case that the input signal is the signal of the second subtype, at least a part of the amplified signal is fed back to the input circuit through the third resistor and the second capacitive element sequentially.

10. The communication system of claim 9, further comprising a selection circuit;

wherein a first end of the selection circuit is connected with the output end of the amplification circuit; a second end of the selection circuit is connected with the first feedback circuit; and a third end of the selection circuit is connected with the second feedback circuit;

the selection circuit is configured to select the first feedback circuit as the one target feedback circuit in the case that the input signal is of the first type and the first subtype; and to select the second feedback circuit as the one target feedback circuit in the case that the input signal is of the second subtype.

11. The communication system of claim 8, wherein the turn-on circuit is configured to be turned on in the case that the input signal is the signal of the second subtype; and to be turned off in the case that the input signal is the signal of the first type or the first subtype.

12. The communication system of claim 8, wherein the turn-on circuit comprises a switching unit and a diode which are connected in sequence;

the switching unit is configured to be switched off in the case that the input signal is of the first type; and to be switched on in the case that the input signal is of the second type; and the diode is configured to be turned off in the case that the input signal is of the first subtype; and to be turned on in the case that the input signal is of the second subtype.

13. The communication system of claim 8, further comprising a power supplying circuit;

wherein the power supplying circuit is connected with a power supplying end of the amplification circuit and is configured to supply power to the amplification circuit so that the amplification circuit operates in a linear amplification region; and the amplification circuit is configured to amplify the input signal and the feedback signal when operating in the linear amplification region.

\* \* \* \* \*